(12) United States Patent
Nonobe et al.

(10) Patent No.: US 11,099,546 B2
(45) Date of Patent: *Aug. 24, 2021

(54) SCHEDULER, SUBSTRATE PROCESSING APPARATUS, AND SUBSTRATE CONVEYANCE METHOD

(71) Applicant: EBARA CORPORATION, Tokyo (JP)

(72) Inventors: Koji Nonobe, Tokyo (JP); Takashi Mitsuya, Tokyo (JP); Ryuya Koizumi, Tokyo (JP); Kunio Oishi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/036,189

(22) Filed: Sep. 29, 2020

(65) Prior Publication Data
US 2021/0011462 A1 Jan. 14, 2021

Related U.S. Application Data

(63) Continuation of application No. 15/868,753, filed on Jan. 11, 2018, now Pat. No. 10,824,135.

(30) Foreign Application Priority Data

Jan. 17, 2017 (JP) .................................. 2017-005729

(51) Int. Cl.
*H01L 21/677* (2006.01)
*G05B 19/418* (2006.01)
(Continued)

(52) U.S. Cl.
CPC ... *G05B 19/4155* (2013.01); *G05B 19/41865* (2013.01); *H01L 21/6723* (2013.01);
(Continued)

(58) Field of Classification Search
None
See application file for complete search history.

(56) References Cited

U.S. PATENT DOCUMENTS 6,772,029 B2 8/2004 Kobayashi et al.
9,166,906 B2 10/2015 Laskowski
(Continued)

FOREIGN PATENT DOCUMENTS

JP    H10-031504 A    2/1998
JP    2011-243812 A   12/2011
(Continued)

*Primary Examiner* — Jennifer L Norton
(74) *Attorney, Agent, or Firm* — BakerHostetler

(57) ABSTRACT

A calculation amount and calculation time for a substrate conveyance schedule are reduced. A scheduler is provided which is incorporated in a control section of a substrate processing apparatus including a plurality of substrate processing sections that process a substrate, a conveyance section that conveys the substrate, and the control section that controls the conveyance section and the substrate processing sections, and calculates a substrate conveyance schedule. The scheduler includes: a modeling section that models processing conditions, processing time and constraints of the substrate processing apparatus into nodes and edges using a graph network theory, prepares a graph network, and calculates a longest route length to each node; and a calculation section that calculates the substrate conveyance schedule based on the longest route length.

6 Claims, 11 Drawing Sheets

(51) Int. Cl.
*G05B 19/4155* (2006.01)
*H01L 21/67* (2006.01)

(52) U.S. Cl.
CPC .. *H01L 21/67253* (2013.01); *H01L 21/67276* (2013.01); *H01L 21/67745* (2013.01); *H01L 21/67766* (2013.01); *H01L 21/67778* (2013.01); *G05B 2219/32252* (2013.01); *G05B 2219/45031* (2013.01); *Y02P 90/02* (2015.11)

(56) References Cited

U.S. PATENT DOCUMENTS

| | | | |
|---|---|---|---|
| 10,119,826 B2 | 11/2018 | Di Lorenzo et al. | |
| 2003/0028282 A1* | 2/2003 | Oh | G06Q 10/06 700/213 |
| 2003/0156543 A1 | 8/2003 | Sahinoglu et al. | |
| 2005/0043884 A1 | 2/2005 | Atarashi | |
| 2007/0168067 A1* | 7/2007 | Yaji | G05B 19/41865 700/100 |
| 2011/0060443 A1* | 3/2011 | Schwarm | G05B 13/042 700/104 |
| 2011/0172800 A1 | 7/2011 | Koizumi et al. | |
| 2011/0206034 A1 | 8/2011 | Kurita et al. | |
| 2016/0189072 A1 | 6/2016 | Kuroki et al. | |
| 2019/0271970 A1 | 9/2019 | Nonobe et al. | |
| 2020/0020560 A1 | 1/2020 | Hayashi | |
| 2020/0035532 A1 | 1/2020 | Takuma | |
| 2020/0371440 A1* | 11/2020 | Matsuyama | G03F 7/3042 |

FOREIGN PATENT DOCUMENTS

| | | |
|---|---|---|
| JP | 5620680 B2 | 11/2014 |
| JP | 2015-060566 A | 3/2015 |

* cited by examiner

Fig. 8

| START TIME | TARGET | PROCESSING |
|---|---|---|
| 0 | WH1 | A |
| 30 | WH1 | B |
| 50 | WH2 | A |
| 68 | WH1 | C |
| 80 | WH1 | D |
| 84 | WH2 | B |
| 107 | WH2 | C |
| 119 | WH2 | D |

Fig. 9

| Load Robot | | | | |
|---|---|---|---|---|
| MOVEMENT ORIGIN | FOUP1 | FOUP2 | SRD | ... |
| FOUP1 | 0 | 1 | 3 | |
| FOUP2 | 1 | 0 | 2 | |
| SRD | 3 | 2 | 0 | |
| ... | | | | |

Fig. 10

| CONVEYER 23 MOVEMENT ORIGIN | Fixing Station | Prewet | Presoak | Blow | ... |
|---|---|---|---|---|---|
| Fixing Station | 0 | 1 | 2 | 4 | |
| Prewet | 1 | 0 | 1 | 3 | |
| Presoak | 2 | 1 | 0 | 2 | |
| Blow | 4 | 3 | 2 | 0 | |
| ... | | | | | |

Fig. 11

| CONVEYER 24 MOVEMENT ORIGIN | Blow | PlatingA | PlatingB | ... | ... |
|---|---|---|---|---|---|
| Blow | 0 | 2 | 4 | | |
| PlatingA | 2 | 0 | 2 | | |
| PlatingB | 4 | 2 | 0 | | |
| ... | | | | | |
| ... | | | | | |

Fig. 12

|  | POST-PROCESSING TAKEOUT STANDBY UPPER LIMIT |
|---|---|
| Prewet | 30 |
| Presoak | 30 |
| PlatingA | 5 |
| PlatingB | 5 |

Fig. 13

| No. | RECIPE ID | UNIT RECIPE SELECTION ||||||
|---|---|---|---|---|---|---|---|
| | | Prewet | Presoak | PlatingA | PlatingB | Blow | SRD |
| 1 | ABC | STD | — | — | STD | STD | STD |
| 2 | XYZ | TEST | TEST | TEST | — | TEST | TEST |
| ~ | | | | | | | |

Fig. 14

Prewet

| RECIPE ID | PROCESSING TIME |
|---|---|
| STD | 30s |
| TEST | 5s |

Presoak

| RECIPE ID | PROCESSING TIME |
|---|---|
| STD | 30s |
| TEST | 5s |

PlatingA

| RECIPE ID | PROCESSING TIME |
|---|---|
| STD | 500s |
| TEST | 5s |

PlatingB

| RECIPE ID | PROCESSING TIME |
|---|---|
| STD | 500s |
| TEST | 5s |

Blow

| RECIPE ID | PROCESSING TIME |
|---|---|
| STD | 30s |
| TEST | 5s |

SRD

| RECIPE ID | PROCESSING TIME |
|---|---|
| STD | 30s |
| TEST | 5s |

SCHEDULER, SUBSTRATE PROCESSING APPARATUS, AND SUBSTRATE CONVEYANCE METHOD

CROSS-REFERENCE TO RELATED APPLICATION

This application is based upon and claims benefit of priority from U.S. patent application Ser. No. 15/868,753, filed Jan. 11, 2018 which claims benefit of priority from Japanese Patent Application No. 2017-005729 filed on Jan. 17, 2017, the entire contents of which are incorporated herein by reference.

TECHNICAL FIELD

The present invention relates to a scheduler, a substrate processing apparatus, and a substrate conveyance method.

BACKGROUND ART

There are substrate processing apparatuses of various configurations. For example, generally, the substrate processing apparatus including a substrate storage container that houses a plurality of substrates, a plurality of conveyers and a plurality of processing sections is known. In the substrate processing apparatus, the plurality of substrates are successively fed from the substrate storage container into the apparatus, conveyed between the plurality of processing sections by the plurality of conveyers and processed in parallel, and the processed substrates are collected in the substrate storage container. In addition, the substrate processing apparatus including the plurality of substrate storage containers that are made replaceable is also known. In such a substrate processing apparatus, by appropriately replacing the substrate storage container loaded with the processed substrates with the substrate storage container loaded with unprocessed substrates, an operation of the substrate processing apparatus can be continuously performed.

As one example of the substrate processing apparatus described above, a plating apparatus that performs bump formation, TSV formation and rewiring plating is known, for example. In such a substrate processing apparatus, it is demanded to realize high throughput while satisfying a strict process constraint (a predetermined process time interval from start of a certain process to start of the next process). In order to satisfy the strict demand, various scheduling methods for making an optimum substrate conveyance plan have been considered for substrate conveyance control of the plating apparatus. The substrate processing apparatus that calculates a substrate conveyance schedule using a simulation method as the scheduling method is known (PTL 1).

CITATION LIST

Patent Literature

PTL 1 Japanese Patent No. 5620680

SUMMARY OF INVENTION

Technical Problem

In a case of calculating a substrate conveyance schedule using a simulation method, in order to obtain excellent throughput, simulation calculation is performed respectively for combinations of many parameters related to scheduling based on processing conditions and constraints given in advance so that there is a problem that a calculation amount becomes huge and it is not suitable for an actual operation as the substrate processing apparatus. As the solution, it is conceivable to search parameter setting by which a throughput value becomes maximum for a process recipe condition assumed at the point of time of design and narrow down a parameter range assumed to be optimum. When executing actual substrate processing, substrate conveyance simulation is performed for the respective parameters, evaluation values of the throughput are measured, and the parameter to be a maximum throughput value is selected from them. In such a manner, by narrowing down the parameter range assumed to be optimum from a group of many existing parameters, it is needed to shorten simulation calculation time in the actual operation and prevent substrate processing start from being obstructed.

However, in order to prepare the range that the simulation calculation time when loaded on the apparatus is within the calculation time not obstructing the actual operation, which is the parameter range assumed to be optimum, calculation processing in advance of a long period of time (five hours, for example) is needed. In addition, since the prepared parameter range assumed to be optimum is determined based on the assumed process recipe condition, there is a problem that the excellent throughput cannot be achieved in the case that the condition other than the assumed process recipe condition is given or in the case that the substrate processing apparatus is in a nonstationary state of a fault or the like.

The present invention is implemented in consideration of the above-described point. The object is to reduce a calculation amount and calculation time for a substrate conveyance schedule and obtain excellent throughput under any conditions.

Solution to Problem

According to a first aspect, a scheduler is provided which is incorporated in a control section of a substrate processing apparatus including a plurality of substrate processing sections that process a substrate, a conveyance section that conveys the substrate, and the control section that controls the conveyance section and the substrate processing sections, and calculates a substrate conveyance schedule. The scheduler includes: a modeling section that models processing conditions, processing time and constraints of the substrate processing apparatus into nodes and edges using a graph network theory, prepares a graph network, and calculates a longest route length to each node; and a calculation section that calculates the substrate conveyance schedule based on the longest route length.

According to the first aspect, the substrate conveyance schedule is calculated based on the longest route length to each node modeled using the graph network theory. Therefore, the substrate conveyance schedule can be calculated without performing advance calculation processing for narrowing down a parameter range that conventionally needed a lot of calculation time so that a calculation amount and calculation time can be reduced. In addition, since it is not needed to limit parameters (processing conditions) for obtaining optimum throughput beforehand, the substrate conveyance schedule capable of achieving the excellent throughput even in the case that the condition other than the assumed process recipe is given can be calculated.

According to a second aspect, in the scheduler of the first aspect, the substrate processing section includes a plating section that performs plating on the substrate held by a substrate holder. The conveyance section includes a preceding stage conveyance section that conveys the substrate between a substrate storage container housing the substrate and a fixing station attaching and detaching the substrate to/from the substrate holder, and a subsequent stage conveyance section that conveys the substrate between the fixing station and the plating section. The substrate processing apparatus includes an apparatus preceding stage section including the preceding stage conveyance section and an apparatus subsequent stage section including the plating section and the subsequent stage conveyance section. The modeling section models the processing conditions, the processing time and the constraints of the apparatus preceding stage section and the apparatus subsequent stage section respectively, and separately prepares a preceding stage side graph network in the apparatus preceding stage section and a subsequent stage side graph network in the apparatus subsequent stage section. The scheduler further includes a connecting section that performs processing of connecting the preceding stage side graph network and the subsequent stage side graph network and calculates the longest route length to each node. The calculation section calculates the substrate conveyance schedule based on the longest route length to each node calculated in the connecting section.

According to the second aspect, the processing conditions, the processing time and the constraints of the apparatus preceding stage section and the apparatus subsequent stage section are modeled respectively, the preceding stage side graph network in the apparatus preceding stage section and the subsequent stage side graph network in the apparatus subsequent stage section are separately prepared, and then the processing of connecting the respective networks is performed. Since the number of the nodes that connect the networks of the apparatus preceding stage section and the apparatus subsequent stage section by the edges is small compared to the number of the nodes of the entire network, calculation is simplified compared to the case of calculating the graph network of the entire apparatus altogether, and the calculation amount and the calculation time can be reduced.

According a third aspect, in the scheduler of the second aspect, the scheduler divides a specified processing number of the substrates into mini batches of an arbitrary number of the substrates. The modeling section prepares the preceding stage side graph network for the mini batch and the subsequent stage side graph network for the mini batch. The connecting section connects the preceding stage side graph network for the mini batch and the subsequent stage side graph network for the mini batch. The scheduler repeats preparation and connection of the preceding stage side graph network for the mini batch and the subsequent stage side graph network for the mini batch as many times as the specified processing number.

According to the third aspect, compared to the case of performing connection after the graph networks of the preceding stage section and the subsequent stage section are prepared for the entire specified processing number, calculation processing at the time of the connection can be reduced. In addition, by arbitrarily changing the number of the substrates in the mini batch according to the processing conditions, the condition of short calculation time can be selected.

According to a fourth aspect, in the scheduler of any one of the first to third aspects, a detection section that detects whether or not the substrate processing apparatus has shifted to a nonstationary state is provided, the modeling section models the processing conditions, the processing time and the constraints of the substrate processing apparatus in the nonstationary state to the nodes and the edges using the graph network theory when the detection section detects that the substrate processing apparatus has shifted to the nonstationary state, prepares the graph network, and calculates the longest route length to each node, and the calculation section is configured to calculate the substrate conveyance schedule based on the longest route length to each node in the nonstationary state.

According to the fourth aspect, even when the substrate processing apparatus shifts to the nonstationary state, since the substrate conveyance schedule is calculated based on the longest route length to each node in the nonstationary state, the substrate conveyance schedule appropriate in the nonstationary state can be calculated.

According to a fifth aspect, in the scheduler of the fourth aspect, the nonstationary state includes a state at the time of a fault of the substrate processing apparatus, a state at the time of maintenance of a substrate holder, or a state at the time of maintenance of an anode holder.

According to the fifth aspect, the appropriate substrate conveyance schedule in a sudden nonstationary state such as the fault of the substrate processing apparatus can be calculated. In addition, the substrate holder and the anode holder sometimes need cleaning and inspections when used for a long period of time, and are maintained (cleaned or inspected) periodically by being taken out from the substrate processing apparatus or inside the substrate processing apparatus. According to the one aspect, even in the nonstationary state that is periodically generated such as the maintenance, the appropriate substrate conveyance schedule can be calculated.

According to a sixth aspect, a substrate processing apparatus including the control section incorporating the scheduler of any one of the first to fifth aspects is provided. In the substrate processing apparatus, the control section is configured to control the conveyance section based on the calculated substrate conveyance schedule.

According to the sixth aspect, the substrate can be appropriately conveyed based on the calculated substrate conveyance schedule.

According to a seventh aspect, a substrate conveyance method using a substrate processing apparatus including a plurality of substrate processing sections that process a substrate, a conveyance section that conveys the substrate, and a control section that controls the conveyance section and the substrate processing sections is provided. The substrate conveyance method includes: a modeling step of modeling processing conditions, processing time and constraints of the substrate processing apparatus into nodes and edges using a graph network theory, preparing a graph network, and calculating a longest route length to each node; a calculation step of calculating a substrate conveyance schedule based on the longest route length; and a step of conveying the substrate based on the substrate conveyance schedule.

According to the seventh aspect, the substrate conveyance schedule is calculated based on the longest route length to each node modeled using the graph network theory. Therefore, the substrate conveyance schedule can be calculated without performing advance calculation processing for narrowing down a parameter range that conventionally needed a lot of calculation time so that the calculation amount and the calculation time can be reduced. In addition, since it is not needed to limit parameters (processing conditions) for obtaining optimum throughput beforehand, the substrate conveyance schedule capable of achieving the excellent throughput even in the case that the condition other than the assumed process recipe is given can be calculated.

According to an eighth aspect, in the substrate conveyance method of the seventh aspect, the substrate processing section includes a plating section that performs plating on the substrate held by a substrate holder, the conveyance section includes a preceding stage conveyance section that conveys the substrate between a substrate storage container housing the substrate and a fixing station attaching and detaching the substrate to/from the substrate holder, and a subsequent stage conveyance section that conveys the substrate between the fixing station and the plating section, and the substrate processing apparatus includes an apparatus preceding stage section including the preceding stage conveyance section and an apparatus subsequent stage section including the plating section and the subsequent stage conveyance section. The modeling step models the processing conditions, the processing time and the constraints of the apparatus preceding stage section and the apparatus subsequent stage section respectively, and separately prepares a preceding stage side graph network in the apparatus preceding stage section and a subsequent stage side graph network in the apparatus subsequent stage section. The substrate conveyance method further includes a connecting step of performing processing of connecting the preceding stage side graph network and the subsequent stage side graph network and calculating the longest route length to each node. The calculation step calculates the substrate conveyance schedule based on the longest route length calculated in the connecting step.

According to the eighth aspect, the processing conditions, the processing time and the constraints of the apparatus preceding stage section and the apparatus subsequent stage section are modeled respectively, the preceding stage side graph network in the apparatus preceding stage section and the subsequent stage side graph network in the apparatus subsequent stage section are separately calculated, and the respective networks are connected thereafter. Since the number of the nodes that connect the networks of the apparatus preceding stage section and the apparatus subsequent stage section by the edges is small compared to the number of the nodes of the entire network, the calculation is simplified compared to the case of calculating the substrate conveyance schedule of the entire apparatus, and the calculation amount and the calculation time can be reduced.

According to a ninth aspect, in the substrate conveyance method of the eighth aspect, the substrate conveyance method includes a step of dividing a specified processing number of the substrates into mini batches of an arbitrary number of the substrates, the modeling step prepares the preceding stage side graph network for the mini batch and the subsequent stage side graph network for the mini batch, the connecting step connects the preceding stage side graph network for the mini batch and the subsequent stage side graph network for the mini batch, and the substrate conveyance method further includes a step of repeating preparation and connection of the preceding stage side graph network for the mini batch and the subsequent stage side graph network for the mini batch as many times as the specified processing number.

According to the ninth aspect, compared to the case of performing connection after the graph networks of the preceding stage section and the subsequent stage section are prepared for the entire specified processing number, the calculation processing at the time of the connection can be reduced. In addition, by arbitrarily changing the number of the substrates in mini batch according to the processing conditions, the condition of short calculation time can be selected.

According to a tenth aspect, in the substrate conveyance method of any one of the seventh to ninth aspects, a step of detecting whether or not the substrate processing apparatus has shifted to a nonstationary state is provided, the modeling step includes a step of modeling the processing conditions, the processing time and the constraints of the substrate processing apparatus in the nonstationary state to the nodes and the edges using the graph network theory when it is detected that the substrate processing apparatus has shifted to the nonstationary state, preparing the graph network, and calculating the longest route length to each node, and the calculation step includes a step of calculating the substrate conveyance schedule based on the longest route length to each node in the nonstationary state.

According to the tenth aspect, even when the substrate processing apparatus has shifted to the nonstationary state, since the substrate conveyance schedule is calculated based on the processing conditions, the processing time and the constraints, the substrate conveyance schedule appropriate in the nonstationary state can be calculated.

According to an eleventh aspect, in the substrate conveyance method of the tenth aspect, the nonstationary state includes a state at the time of a fault of the substrate processing apparatus, a state at the time of maintenance of a substrate holder, or a state at the time of maintenance of an anode holder.

According to the eleventh aspect, the appropriate substrate conveyance schedule in a sudden nonstationary state such as the fault of the substrate processing apparatus can be calculated. In addition, the substrate holder and the anode holder sometimes need cleaning and inspections when used for a long period of time, and are maintained (cleaned or inspected) periodically by being taken out from the substrate processing apparatus or inside the substrate processing apparatus. According to the one aspect, even in the nonstationary state that is periodically generated such as the maintenance, the appropriate substrate conveyance schedule can be calculated.

Advantageous Effects of Invention

According to at least one aspect of the present invention, a calculation amount and calculation time for a substrate conveyance schedule can be reduced.

BRIEF DESCRIPTION OF DRAWINGS

FIG. 8 is a diagram illustrating a part of a substrate conveyance schedule;

FIG. 9 is a diagram illustrating one example of conveyance processing time of a loading robot set to the substrate conveyance control scheduler;

FIG. 10 is a diagram illustrating one example of conveyance processing time of a conveyer set to the substrate conveyance control scheduler;

FIG. 11 is a diagram illustrating one example of the conveyance processing time of the conveyer set to the substrate conveyance control scheduler;

FIG. 12 is a diagram illustrating one example of constraints set to the substrate conveyance control scheduler;

FIG. 13 is a diagram illustrating one example of an entire recipe set to the substrate conveyance control scheduler;

FIG. 14 is a diagram illustrating one example of a process recipe set to the substrate conveyance control scheduler;

DESCRIPTION OF EMBODIMENTS

Figure 1:
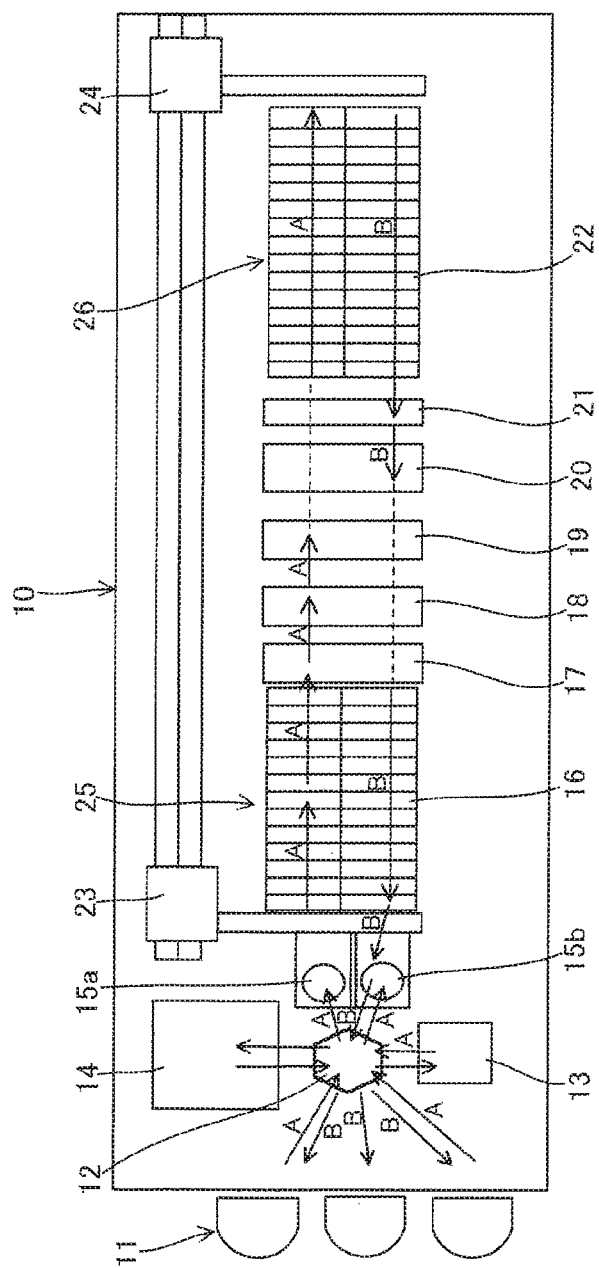
FIG. 1 is a schematic diagram illustrating a configuration example of a plating apparatus relating to an embodiment of the present invention.

Hereinafter, an embodiment of the present invention will be described with reference to the drawings. In the drawings described below, same signs are attached to same or corresponding components and redundant description is omitted. In the present embodiment, a substrate processing apparatus is described with a plating apparatus that performs plating on a semiconductor substrate as an example, but the substrate processing apparatus relating to the present invention is not limited to the plating apparatus, and the present invention is applicable to various kinds of substrate processing apparatuses such as the substrate processing apparatus that performs processing for manufacturing an LCD to a glass substrate.

FIG. 1 is a schematic diagram illustrating a configuration example of a plating apparatus relating to the embodiment of the present invention. The present plating apparatus 10 includes a loading port 11, a loading robot 12, an aligner 13, a spin rinse dryer (SRD) 14, fixing stations 15a and 15b, a substrate holder storage area 25 including a plurality of stockers 16, a pre-washing bath 17, a preprocessing bath 18, a washing bath 19, a rough drying bath (blow bath) 20, a washing bath 21, a plating area 26 (corresponding to one example of a plating section) including a plurality of plating baths 22, and two conveyers 23 and 24. The spin rinse dryer 14, the pre-washing bath 17, the preprocessing bath 18, the washing bath 19, the blow bath 20, the washing bath 21, and the plating baths 22 function as a substrate processing section that performs predetermined processing to a substrate. In addition, the loading robot 12 and the conveyers 23 and 24 function as a conveyance section that conveys the substrate.

In FIG. 1, arrows A indicate a loading transfer stroke of the substrate, and arrows B indicate an unloading transfer stroke of the substrate. On the loading port 11, a substrate storage container (FOUP: Front Opening Unified Pot) storing a plurality of unprocessed substrates and a plurality of processed substrates is mounted.

In the plating apparatus 10, the loading robot 12 takes out the unprocessed substrate from the substrate storage container mounted on the loading port 11, and mounts it on the aligner 13. The aligner 13 positions the substrate with a notch or an orientation flat or the like as a reference. Then, the loading robot 12 transfers the substrate to the fixing stations 15a and 15b, and the fixing stations 15a and 15b mounts the substrate on a substrate holder taken out from the stocker 16. The plating apparatus 10 is configured to mount the substrate on the respective substrate holders in the two fixing stations 15a and 15b and convey the two substrate holders as one set. The substrates mounted on the substrate holders are transferred to the pre-washing bath 17 by the conveyer 23, pre-washed in the pre-washing bath 17, and then transferred to the preprocessing bath 18. The substrate preprocessed in the preprocessing bath 18 is transferred further to the washing bath 19, and washed in the washing bath 19.

The substrate washed in the washing bath 19 is transferred to one of the plating baths 22 in the plating area 26 by the conveyer 24, and immersed in plating liquid. Plating is executed here and a metal film is formed on the substrate. The substrate on which the metal film is formed is transferred to the washing bath 21 by the conveyer 24, and washed in the washing bath 21. Subsequently, the substrate is transferred to the blow bath 20 by the conveyer 24, subjected to rough drying processing, then transferred to the fixing stations 15a and 15b by the conveyer 23, and detached from the substrate holder. The substrate detached from the substrate holder is transferred to the spin rinse dryer 14 by the loading robot 12, subjected to washing/drying processing, and then stored at a predetermined position of the substrate storage container mounted on the loading port 11.

The plating apparatus 10 relating to the present embodiment is divided, for convenience, into an apparatus preceding stage section including the loading robot 12 (corresponding to one example of a preceding stage conveyance section) that conveys the substrate between the loading port 11 and the fixing stations 15a and 15b, and an apparatus subsequent stage section including the conveyers 23 and 24 (corresponding to one example of a subsequent stage conveyance section) that conveys the substrate between the fixing stations 15a and 15b and the plating area 26. In the plating apparatus 10 relating to the present embodiment, as described later, a preceding stage side graph network in the apparatus preceding stage section and a subsequent stage side graph network in the apparatus subsequent stage section are separately calculated.

Figure 2:
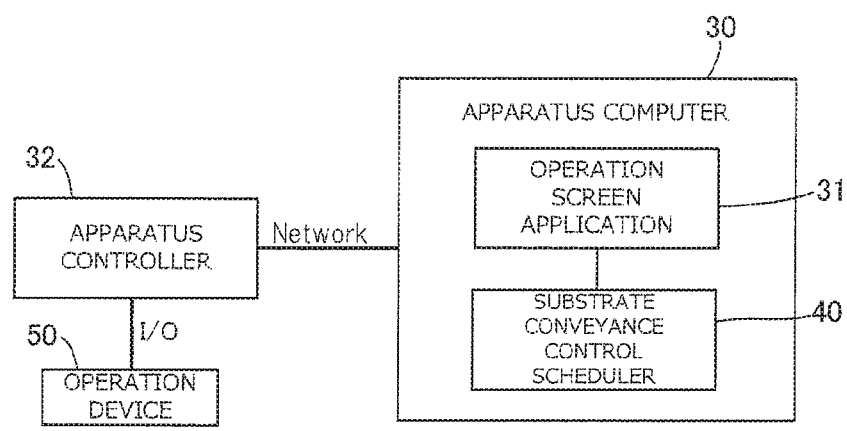
FIG. 2 is a block diagram illustrating one example of a configuration of a control section.

Subsequently, a control section that controls the plating apparatus 10 illustrated in FIG. 1 will be described. FIG. 2 is a block diagram illustrating one example of a configuration of the control section. Conveyance control of the loading transfer stroke of the substrate indicated by the arrows A by the loading robot 12, the conveyer 23 and the conveyer 24 and conveyance control of the unloading transfer stroke of the substrate indicated by the arrows B, which are illustrated in FIG. 1, are performed by control of the control section.

The control section of the plating apparatus 10 includes an apparatus computer 30 and an apparatus controller 32. The apparatus computer 30 mainly performs calculation and data processing or the like, and the apparatus controller 32 is configured to mainly control the respective sections of the plating apparatus 10 illustrated in FIG. 1. In the present embodiment, the apparatus computer 30 and the apparatus controller 32 are separately configured, but without being limited thereto, the apparatus computer 30 and the apparatus controller 32 may be configured as an integrated control section.

The apparatus computer 30 includes an operation screen application 31 that makes an operation screen be displayed at a non-illustrated display section, and a substrate conveyance control scheduler 40 for generating a substrate conveyance control schedule. The apparatus computer 30 includes, in addition, hardware such as a CPU (Central Processing Unit), a ROM (Read Only Memory), a memory and a hard disk needed for realizing the operation screen application 31 and the substrate conveyance control scheduler 40.

The apparatus controller 32 is network-connected with the apparatus computer 30, and is configured to receive a substrate conveyance control schedule generated by the substrate conveyance control scheduler 40 from the apparatus computer 30. The apparatus controller 32 is connected with an operation device 50 including the conveyance section and the substrate processing section illustrated in FIG. 1 communicably through an input/output interface. The apparatus controller 32 controls the operation device 50 according to the substrate conveyance control schedule received from the apparatus computer 30.

Figure 3:
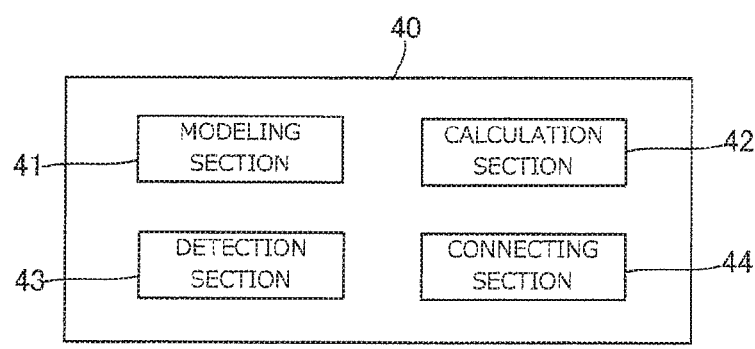
FIG. 3 is a block diagram of a substrate conveyance control scheduler illustrated in FIG. 2.

FIG. 3 is a block diagram of the substrate conveyance control scheduler 40 illustrated in FIG. 2. As illustrated, the substrate conveyance control scheduler 40 includes a modeling section 41, a calculation section 42, a detection section 43, and a connecting section 44. The substrate conveyance control scheduler 40 relating to the present embodiment models processing conditions, processing time and constraints of the plating apparatus 10 into nodes and edges using a graph network theory to be described later, in order to calculate the substrate conveyance schedule. Here, the processing conditions include a kind and order of processing, and a priority degree of the processing or the like. The processing time includes start time of each process, conveyance start time, time needed for the process and time needed for conveyance or the like. In addition, the constraints are conditions that constrain the time needed from the start of certain processing to the start of the next processing or the like. Note that a scheduler is an arithmetic processing unit including at least a storage medium having software for receiving signal information from outside and performing a series of arithmetic processing of calculating the substrate conveyance schedule based on it recorded thereon. Note that the scheduler further includes a storage section for storing data information such as the processing time, the constraints and process recipes (processing conditions), and is configured to perform the above-described arithmetic processing while referring to the information preserved in the storage section.

The modeling section 41 models the processing conditions, the processing time and the constraints of the plating apparatus 10 into a graph network expressed by the nodes and the edges using the graph network theory, and calculates a longest route length to each node. The calculation section 42 calculates the substrate conveyance schedule based on the longest route length to each modeled node. The detection section 43 receives a signal from the apparatus controller 32 illustrated in FIG. 2, and detects whether or not the plating apparatus 10 has shifted to a nonstationary state. Here, the nonstationary state includes a state at the time of a fault of the plating apparatus 10, a state at the time of maintenance of the substrate holder, or a state at the time of maintenance of an anode holder or the like, for example.

In addition, in the present embodiment, the connecting section 44 separately calculates the preceding stage side graph network in the apparatus preceding stage section and a subsequent stage side graph network in the apparatus subsequent stage section, connects the preceding stage side graph network and the subsequent stage side graph network, and calculates the graph network relating to the entire plating apparatus 10.

Figure 4:
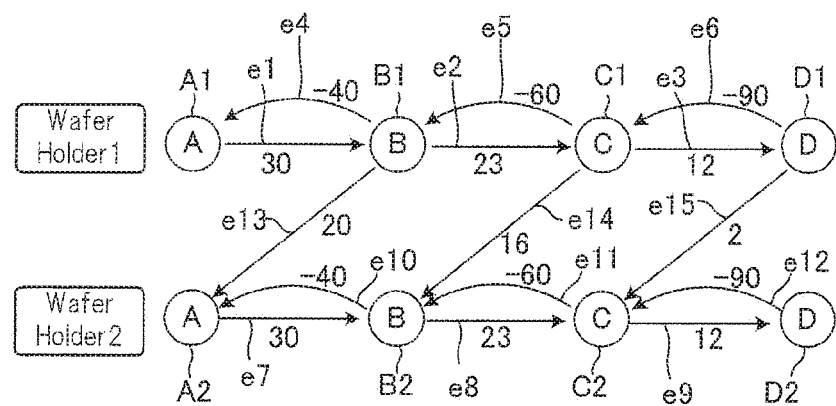
FIG. 4 is a diagram illustrating one example of a graph network modeled by a modeling section illustrated in FIG. 3.

Next, a specific example of calculating the substrate conveyance schedule by the substrate conveyance control scheduler 40 illustrated in FIG. 3 will be described. FIG. 4 is a diagram illustrating one example of the graph network modeled by the modeling section 41 illustrated in FIG. 3. The graph network is simplified for the description.

Premises for modeling the graph network are as follows. That is, two substrate holders holding the substrate to be processed are used. Here, the respective substrate holders are referred to as a first substrate holder (Wafer Holder 1) and a second substrate holder (Wafer Holder 2). The plating apparatus 10 in this example includes four of a unit A, a unit B, a unit C and a unit D, and the processing is started from a state that the two substrate holders are stored in the respectively different unit A. For the units B and C, only one substrate holder can be present. To the respective substrate holders, processing A-D to be the nodes in FIG. 4 is executed. A conceivable order of the processing A-D executed to the respective substrate holders is predetermined based on the process recipe, and the order is indicated by arrows of edges e1-e15 illustrated in FIG. 4. The processing A is takeout processing of the substrate holder from the unit A. The processing B is takeout processing of the substrate holder from the unit B. The processing C is takeout processing of the substrate holder from the unit C. For the processing A, B and C, a series of the processing of takeout of the substrate holder, movement to the next unit and storage in the next unit are continuously executed, respectively. The processing D is storage processing of the substrate holder to the unit D. It is defined that takeout processing time of the processing A-C is 5 seconds, respectively. The processing D is end processing, and the takeout processing time is 0. The respective substrate holders are conveyed one by one by one conveyer. For example, it is defined that moving time of the conveyer between the unit B and the unit C is 3 seconds. It is defined that the moving time of the conveyer between the units B and between the units C is 1 second. To the substrate holder stored in the unit B, the processing of 15 seconds is performed, and to the substrate holder stored in the unit C, processing of 10 seconds is performed. In addition, as the constraints, the time from the start of the processing A to the start of the processing B is 40 seconds or shorter, and the time from the start of the processing B to the start of the processing C is 60 seconds or the like. A list of the premises is illustrated in Table 1 below.

TABLE 1

| Processing list | Processing content |
|---|---|
| A | Start to takeout from unit A |
| B | Start to takeout from unit B |
| C | Start to takeout from unit C |
| D | Storage in unit D (completion) |

TABLE 1-continued

Inter-unit moving time(s)

|  |  | Moving destination | | | |
|---|---|---|---|---|---|
|  |  | A | B | C | D |
| Movement origin | A | 1 | 5 | 7 | 8 |
|  | B | 5 | 1 | 3 | 4 |
|  | C | 7 | 3 | 1 | 2 |
|  | D | 8 | 4 | 2 | 1 |

Takeout processing time(s)

| UNIT A | 5 |
|---|---|
| UNIT B | 5 |
| UNIT C | 5 |
| UNIT D | 0 |

Storage processing time(s)

| UNIT A | 0 |
|---|---|
| UNIT B | 5 |
| UNIT C | 5 |
| UNIT D | 5 |

Recipe processing time(s)

| UNIT A | 0 |
|---|---|
| UNIT B | 15 |
| UNIT C | 10 |
| UNIT D | 0 |

Constraint upper limit time(s)

| A → B | 40 |
|---|---|
| B → C | 60 |
| C → D | 90 |

As illustrated in FIG. 4, required time from the processing A to the processing B regarding the first substrate holder is 5 seconds of the takeout processing time from the unit A, 5 seconds of the moving time of the conveyor from the unit A to the unit B, 5 seconds of the storage processing time to the unit B and 15 seconds of the recipe processing time in the unit B, and is 30 seconds as a total. Thus, the edge e1 is 30 seconds. In addition, an edge e4 is 40 seconds as the constraint of the processing between the units A and B. The constraint here is expressed by a negative number. It is similar between the units B and C and between the units C and D. Regarding the first substrate holder, the required time from the processing B to the processing C is 5 seconds of the takeout processing time from the unit B, 3 seconds of the moving time of the conveyor from the unit B to the unit C, 5 seconds of the storage processing time in the unit C and 10 seconds of the recipe processing time in the unit C, and an edge e2 is 23 seconds.

Subsequently, the required time from the processing C to the processing D regarding the first substrate holder is 5 seconds of the takeout processing time from the unit C, 2 seconds of the moving time of the conveyor from the unit C to the unit D and 5 seconds of the storage processing time to the unit D, and is 12 seconds as the total. Thus, an edge e3 is 12 seconds. Regarding the second substrate holder, each of the required time from the processing A to the processing D is similar to that for the first substrate holder.

In the case of shifting from the processing B of the first substrate holder to the processing A of the second substrate holder, in order for the second substrate holder to start the processing A (takeout from the unit A, movement to the unit B and storage), the unit B needs to be free. Therefore, the processing B of the first substrate holder needs to be executed first. That is, 5 seconds of the takeout time from the unit B, 3 seconds of the moving time from the unit B to the unit C, and 5 seconds of the storage processing time to the unit C are needed. In addition, since the processing B is performed last in the unit C and the processing A is performed in the unit A, 7 seconds of the time for the conveyor to move from the unit C to the unit A are needed. Therefore, the required time from the processing B of the first substrate holder to the processing A of the second substrate holder is 20 seconds. Thus, an edge e13 is 20 seconds. An edge e14 is also similarly calculated, and is 16 seconds. Since the recipe processing time of the unit D is 0 second, the edge e15 is 2 seconds of the moving time from the unit D to the unit C.

In a graph network diagram generated by the modeling section 41 illustrated in FIG. 3 as described above, the longest route length to each node is calculated. Here, the modeling section 41 uses a shortest route problem solution approach in order to calculate the longest route length. Specifically, the modeling section 41 inverts positive/negative of a value of the required time of each edge, and a shortest route to each node is calculated by the known shortest route problem solution approach such as Bellman-Ford algorithm. Here, for the shortest route from the processing A of the first substrate holder to the processing C of the first substrate holder for example, the case of successively executing the processing A of the first substrate holder, the processing B of the first substrate holder and the processing C of the first substrate holder is the shortest route (the value is minimum), and the value of the required time is "−53". The modeling section 41 calculates the value of the shortest route length to each node in this way, and inverts the positive/negative of the value again. The value becomes the value indicating the longest route length to each node. The value indicates the executable fastest processing start time of each processing. Note that the longest route length to each node may be calculated using Dijkstra's algorithm for example, in addition to the Bellman-Ford algorithm.

Figure 5:
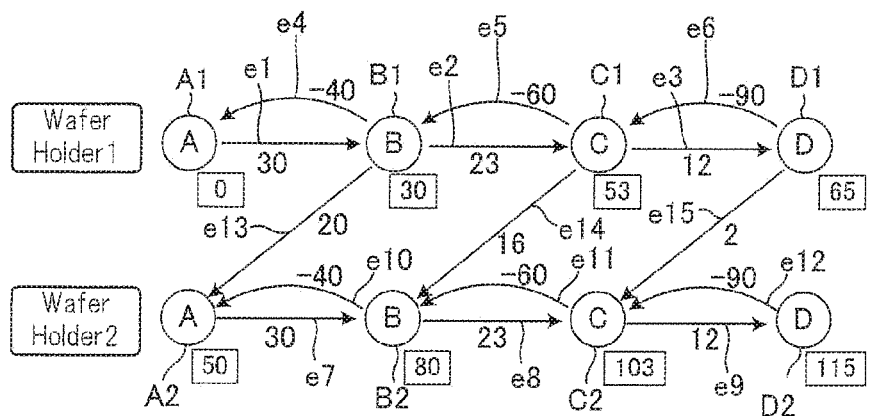
FIG. 5 is a graph network diagram illustrated in FIG. 4, to which a longest route length to each node is added.
Figure 6:
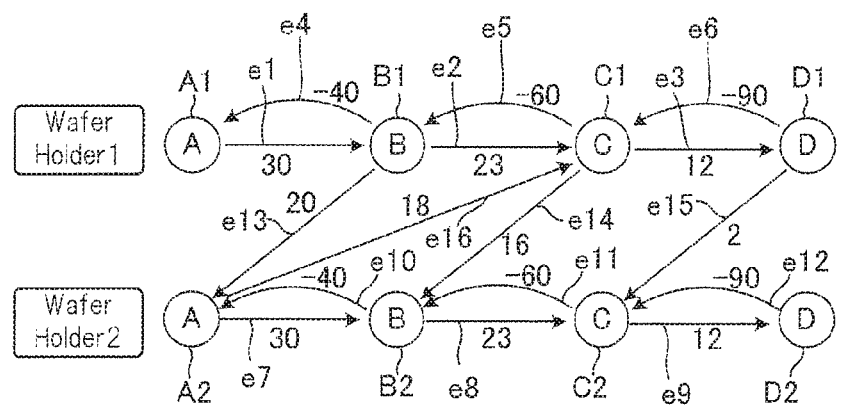
FIG. 6 is a diagram for which an edge for avoiding contention of a conveyer is added to the graph network diagram illustrated in FIG. 5.
Figure 7:
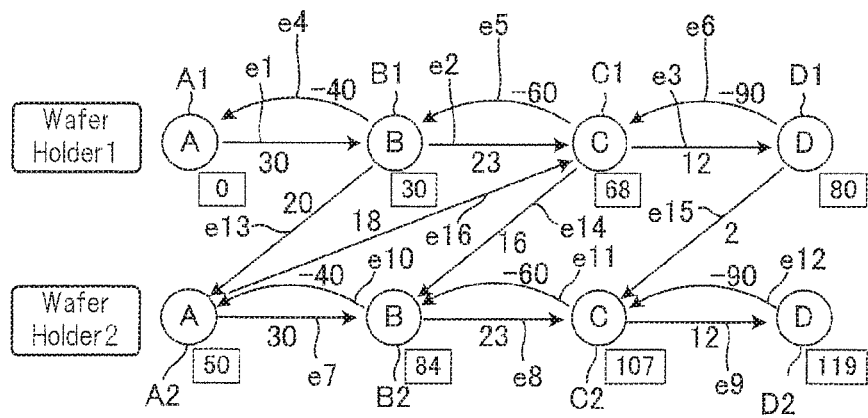
FIG. 7 is a graph network diagram illustrated in FIG. 6, to which the longest route length to each node is added.

FIG. 5 is a graph network diagram illustrated in FIG. 4, to which the longest route length to each node is added. Here, 53 seconds of the start time of the processing C of the first substrate holder and 50 seconds of the start time of the processing A of the second substrate holder are confirmed. When the processing A of the second substrate holder of the early start time is started, since the conveyer cannot be used until 5 seconds of the takeout processing, 5 seconds of moving processing from the unit A to the unit B and 5 seconds of storage processing to the unit B elapse, the processing C of the first substrate holder cannot be executed. In addition, unless 3 seconds of the moving time from the last unit B of the processing A to the unit C at a start position of the processing C elapse, the processing C of the first substrate holder cannot be started. In order to avoid contention of the conveyer in this way, an edge e16 for example needs to be added newly as illustrated in FIG. 6. The edge e16 is 18 seconds as described above. FIG. 7 is a graph network diagram updated by calculating the longest route length to each node again after adding the edge e16. Note that a direction of the edge corresponding to the edge e16 may be opposite, and in that case, an edge length is 20 seconds.

In the graph network diagram, in the case that a loop of a positive length is generated by adding the edge, since the execution becomes impossible (the constraint cannot be kept), it is needed to delete the added edge and add a different edge. In an example in FIG. 7, the loop is present among the processing B of the first substrate holder, the processing A of the second substrate holder and the processing C of the first substrate holder, but there is no problem since the total length is 20+18−60=−22.

The longest route length to each node illustrated in FIG. 7 indicates the executable fastest processing start time of each processing. Therefore, when each processing is executed at the time indicated by the value of the longest route length, substrate conveyance processing of high throughput can be performed.

The calculation section 42 prepares a timetable for conveying each substrate holder, that is, the substrate conveyance schedule, based on the value of the longest route length indicated in FIG. 7. FIG. 8 is a diagram illustrating a part of the substrate conveyance schedule. The substrate conveyance control scheduler 40 transmits the substrate conveyance schedule prepared in this way to the apparatus controller 32 illustrated in FIG. 2. The apparatus controller 32 controls the substrate processing section and the conveyance section based on the substrate conveyance schedule.

In this way, according to the substrate conveyance control scheduler 40 relating to the present embodiment, the substrate conveyance schedule is calculated based on the longest route length to each node regarding the nodes and the edges modeled using the graph network theory. Therefore, the substrate conveyance schedule can be calculated without performing advance calculation processing for narrowing down a parameter range so that the calculation amount and the calculation time can be reduced. In addition, since it is not needed to limit parameters (processing conditions) for obtaining the optimum throughput, the substrate conveyance schedule capable of achieving the excellent throughput even in the case that the condition other than the assumed process recipe is given can be calculated.

Next, specific examples of the processing conditions, the processing time and the constraints of the plating apparatus 10 set to the substrate conveyance control scheduler 40 will be described. FIG. 9 is a diagram illustrating one example of conveyance processing time of the loading robot 12 set to the substrate conveyance control scheduler 40. The diagram illustrates the time (seconds) needed for the loading robot 12 to convey the substrate among the one substrate storage container (FOUP 1), the other substrate storage container (FOUP 2), and the spin rinse dryer 14 or the like. For example, the processing time of 1 second is needed for the loading robot 12 to convey the substrate from the FOUP 1 to the FOUP 2. As each required time illustrated in FIG. 9, the value measured beforehand is set to the substrate conveyance control scheduler 40.

FIG. 10 is a diagram illustrating one example of the conveyance processing time of the conveyer 23 set to the substrate conveyance control scheduler 40, and FIG. 11 is a diagram illustrating one example of the conveyance processing time of the conveyer 24 set to the substrate conveyance control scheduler 40. FIG. 10 illustrates the time (seconds) needed for the conveyer 23 to convey the substrate among the fixing stations 15a and 15b, the preprocessing bath 18 (Prewet), the washing bath 19 (Presoak) and the blow bath 20 (Blow) or the like. In addition, FIG. 11 illustrates the time (seconds) needed for the conveyer 24 to convey the substrate among the blow bath 20, one plating bath 22, and the other plating bath 22 or the like. Required moving time of each conveyance section illustrated in FIG. 9 to FIG. 11 is set to the substrate conveyance control scheduler 40 beforehand as the processing time.

Subsequently, the constraints set to the substrate conveyance control scheduler 40 will be described. FIG. 12 is a diagram illustrating one example of the constraints set to the substrate conveyance control scheduler 40. As illustrated in this example, the constraints (seconds) of the preprocessing bath 18 (Prewet), the washing bath 19 (Presoak), the one plating bath 22 (Plating A), and the other plating bath 22 (Plating B) or the like are illustrated. According to the constraints illustrated in FIG. 12, for example, the conveyer 23 has to take out the substrate stored in the preprocessing bath 18 within 30 seconds after preprocessing is ended.

Next, the process recipes and the process processing time set to the substrate conveyance control scheduler 40 will be described. FIG. 13 is a diagram illustrating one example of an entire recipe set to the substrate conveyance control scheduler 40. As illustrated in FIG. 13, the plurality of process recipes are set to the substrate conveyance control scheduler 40. In the illustrated example, recipe IDs "ABC" and "XYZ" are set. In the respective recipe IDs, unit recipes can be selected. In the illustrated example, in the recipe ID "ABC", the processing in the preprocessing bath 18 (Prewet), the processing in the other plating bath 22 (Plating B), the processing in the blow bath 20 (Blow), and the processing in the spin rinse dryer 14 (SRD) are set to be performed under ordinary conditions (STD: Standard). In addition, in the recipe ID "XYZ", each illustrated processing is set to be performed under a test condition (TEST).

FIG. 14 is a diagram illustrating one example of the process recipe set to the substrate conveyance control scheduler 40. As illustrated in FIG. 14, the processing time for the ordinary condition (STD) and the test condition (TEST) in the preprocessing bath 18 (Prewet), the washing bath 19 (Presoak), the one plating bath 22 (Plating A), the other plating bath 22 (Plating B), the blow bath 20 (Blow), and the spin rinse dryer 14 (SRD) is set respectively. The ordinary condition and the test condition illustrated in FIG. 13 follow the processing time illustrated in FIG. 14.

Figure 15:
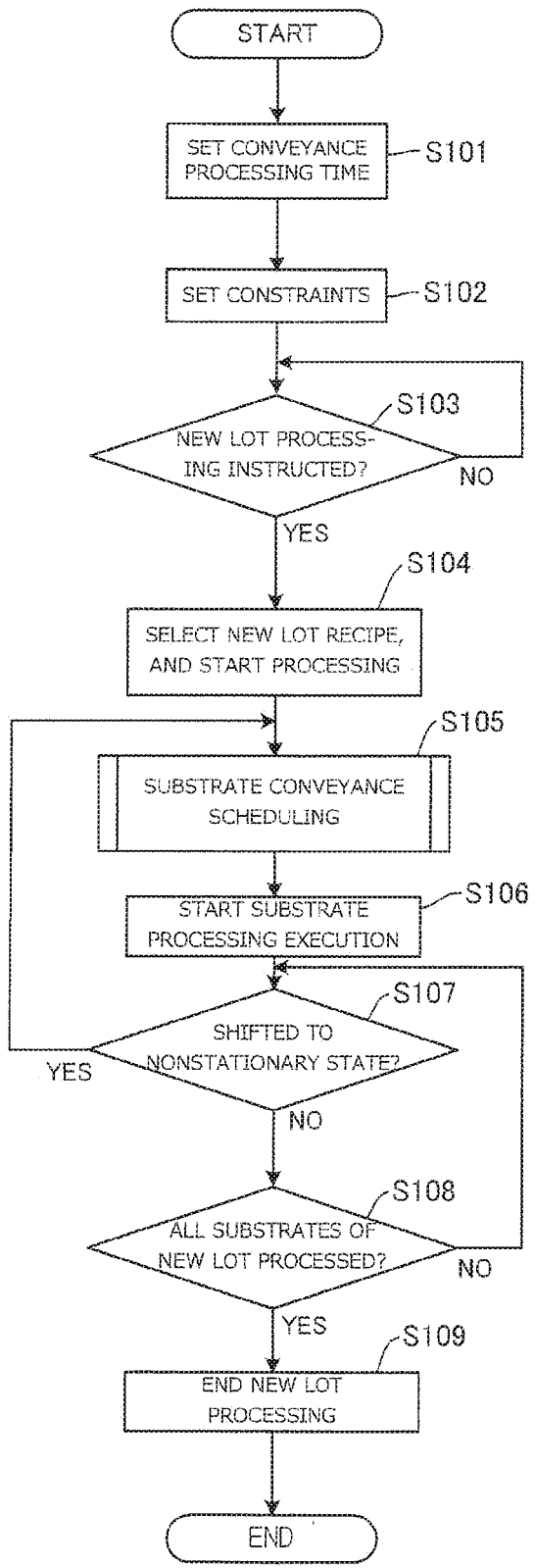
FIG. 15 is a flowchart illustrating a substrate processing method relating to the present embodiment.

Next, a substrate processing method by the plating apparatus 10 relating to the present embodiment will be described. FIG. 15 is a flowchart illustrating the substrate processing method relating to the present embodiment. As illustrated in FIG. 15, first, an operator sets the conveyance processing time of the substrate illustrated in FIG. 9 to FIG. 11 and the constraints illustrated in FIG. 12 to the plating apparatus 10, through a non-illustrated input section provided in the apparatus computer 30 of the plating apparatus 10 (step S101, step S102). The processing time and the constraints in the nonstationary state to be described later are stipulated in the plating apparatus 10 beforehand according to situations of the nonstationary state such as a kind of a fault.

Subsequently, whether or not new lot processing is instructed, that is, new substrate processing is instructed is determined (step S103). When the new lot processing is instructed (step S103, YES), one of the process recipes (processing conditions) illustrated in FIG. 13 is selected, and the processing is started (step S104). Note that the selection of the process recipe may be inputted by the operator through the input section of the apparatus computer 30 or inputted from a non-illustrated host computer network-connected with the apparatus computer 30.

Next, the calculation section 42 of the substrate conveyance control scheduler 40 calculates the substrate conveyance schedule (step S105). A detailed process of step S105 will be described later. When the substrate conveyance schedule, that is, the timetable, is determined by step S105, the apparatus controller 32 executes the substrate processing (step S106).

The detection section 43 detects whether or not the plating apparatus 10 has shifted to the nonstationary state during the execution of the substrate processing (step S107). Here, the nonstationary state includes the state at the time of a fault of the plating apparatus 10, the state at the time of maintenance of the substrate holder, or the state at the time of maintenance of the anode holder or the like. In the plating apparatus 10, a rectifier of the plating bath 22 or the like for example sometimes fails suddenly, and one of the plating baths 22 becomes unusable in this case. In addition, the substrate holder and the anode holder sometimes need cleaning and inspections when used for a long period of time, and are maintained (cleaned or inspected) periodically by being taken out from the plating apparatus 10 or inside the substrate processing apparatus. In this case, the usable substrate holder and the number of the substrate holders are changed, and the throughput of the plating apparatus 10 is affected. Therefore, in the case of determining that the plating apparatus 10 has shifted to the nonstationary state (step S107, YES), the processing returns to step S105, and the substrate conveyance schedule is calculated again based on the processing conditions, the processing time and the constraints in the nonstationary state.

In the case of determining that the plating apparatus 10 has not shifted to the nonstationary state (step S107, NO), whether or not all the substrates within a new lot have been processed is determined (step S108). In the case that the substrate to be processed remains (step S108, NO), the processing returns to step S107, and whether or not the plating apparatus 10 has shifted to the nonstationary state is detected. When all the substrates within the new lot are processed (step S108, YES), the processing of the new lot is ended (S109).

Figure 16:
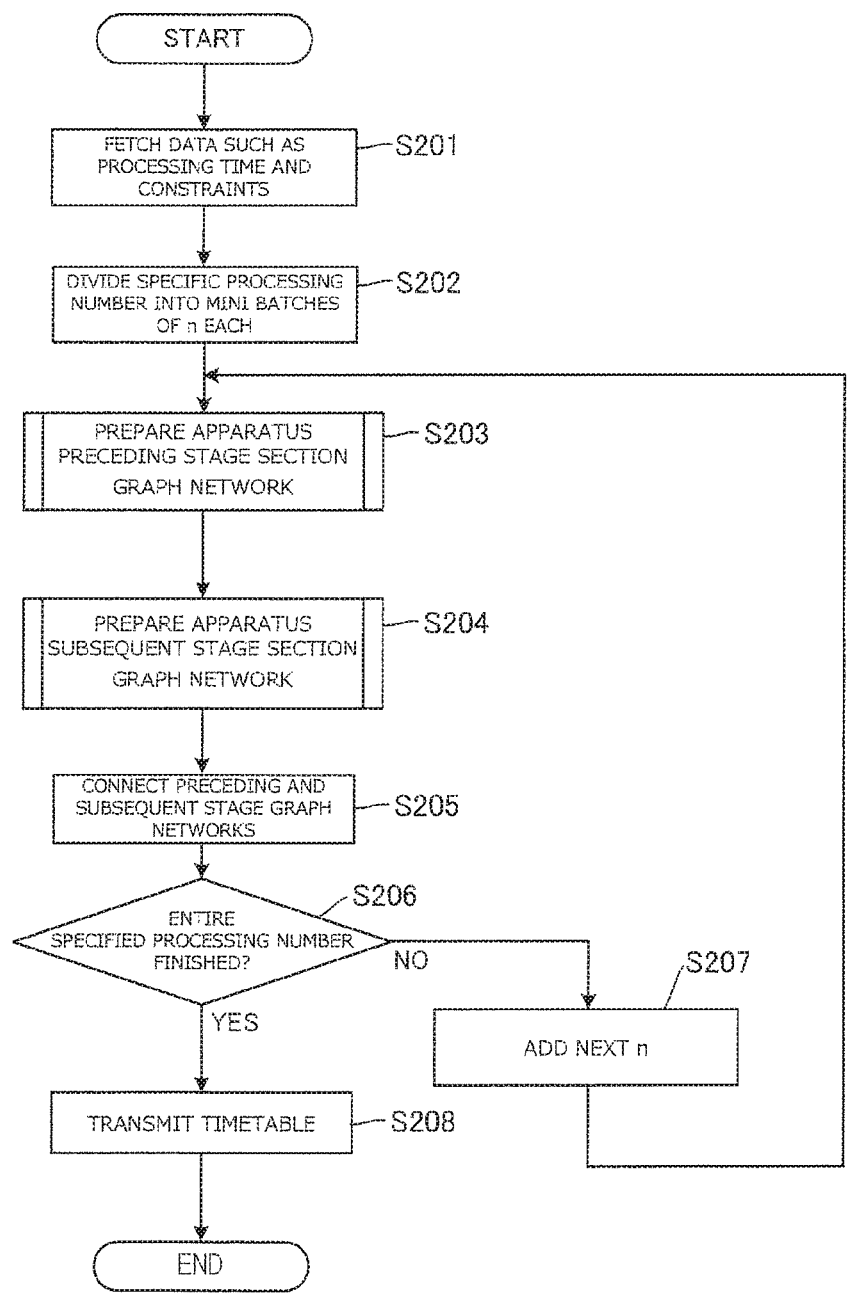
FIG. 16 is a flowchart illustrating subroutines of step S105.

A specific calculation procedure of the substrate conveyance schedule in step S105 illustrated in FIG. 15 will be described. FIG. 16 is a flowchart illustrating subroutines of step S105. As illustrated, in order to calculate the substrate conveyance schedule, first, the data such as the processing time illustrated in FIG. 9 to FIG. 11 and FIG. 14, the constraints illustrated in FIG. 12 and the process recipes (processing conditions) illustrated in FIG. 13 is fetched to the substrate conveyance control scheduler 40 (step S201). Note that, when it is detected that the plating apparatus 10 has shifted to the nonstationary state in step S107 in FIG. 15, in step S201, the data such as the processing conditions, the processing time and the constraints of the plating apparatus 10 in the nonstationary state is fetched to the substrate conveyance control scheduler 40.

Subsequently, the substrate conveyance control scheduler 40 first divides a specified processing number of the substrates into some mini batches of every n substrates (n is an arbitrary number equal to or larger than 1) (step S202). Thereafter, the substrate conveyance control scheduler 40 calculates the graph network of the apparatus preceding stage section (step S203). Thereafter, the substrate conveyance control scheduler 40 calculates the graph network of the apparatus subsequent stage section (step S204).

The connecting section 44 connects the graph network of the apparatus preceding stage section calculated in step S203 and the graph network of the apparatus subsequent stage section calculated in step S204 as the graph network as the entire apparatus, by adding the edge between the related nodes (step S205). Next, when it is confirmed that the calculation is finished for the entire specified processing number, and when the specified processing number is not reached (step S206, NO), the next n substrates are added (step S207), and the processing returns to the processing in step S203. When the specified processing number is reached (step S206, YES), the calculation section 42 calculates the substrate conveyance schedule based on the longest route length to each node in the graph network of the entire apparatus, and transmits the substrate conveyance schedule to the apparatus controller 32 illustrated in FIG. 2, as a substrate conveyance timetable (step S208). The apparatus controller 32 controls the conveyance section of the plating apparatus 10 so as to convey the substrate based on the substrate conveyance timetable.

Figure 17:
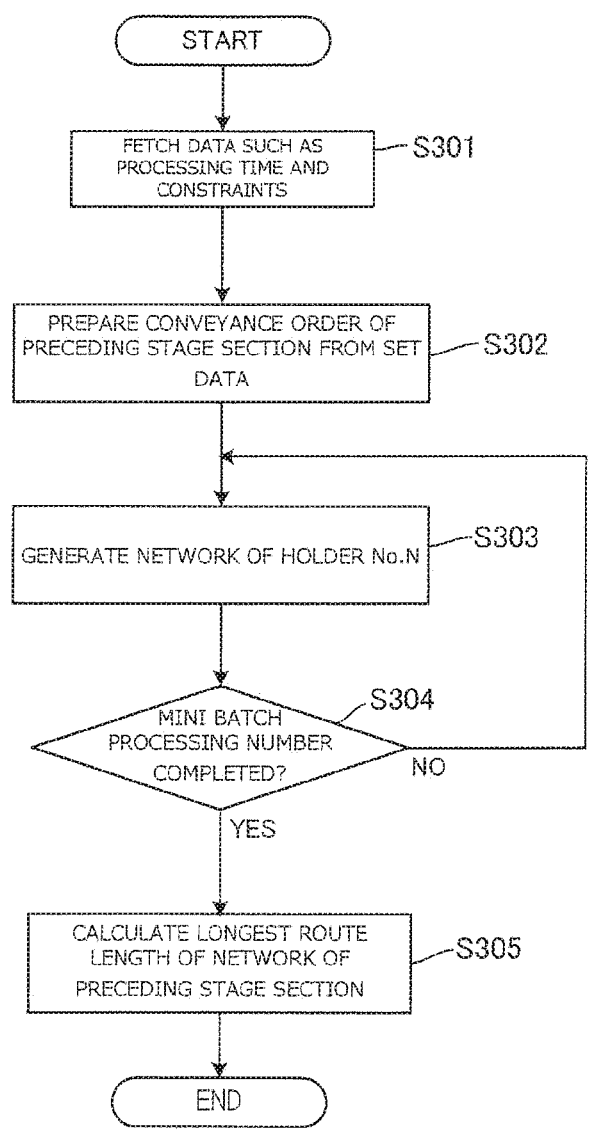
FIG. 17 is a flowchart illustrating subroutines of step S203.

Subsequently, a specific calculation procedure of the substrate conveyance schedule of the apparatus preceding stage section in step S203 illustrated in FIG. 16 will be described. FIG. 17 is a flowchart illustrating the subroutines of step S203. As illustrated, in order to calculate the substrate conveyance schedule of the apparatus preceding stage section, first, the data such as the processing time, the constraints and the process recipes (processing conditions) related to the apparatus preceding stage section is fetched to the substrate conveyance control scheduler 40 (step S301). From the fetched data, a conveyance order of the apparatus preceding stage section is prepared (step S302). The conveyance order is prepared based on the process recipes (processing conditions) in particular.

Subsequently, the modeling section 41 models the processing conditions, the processing time and the constraints into the nodes and the edges using the graph network theory, and generates the graph network corresponding to each substrate holder as illustrated in FIG. 4 (step S303). When the graph network for the substrate holder of a mini batch processing number given in step S202 illustrated in FIG. 16 is additionally generated (step S304, Yes), the longest route length to each node is calculated based on the generated graph network (step S305).

Figure 18:
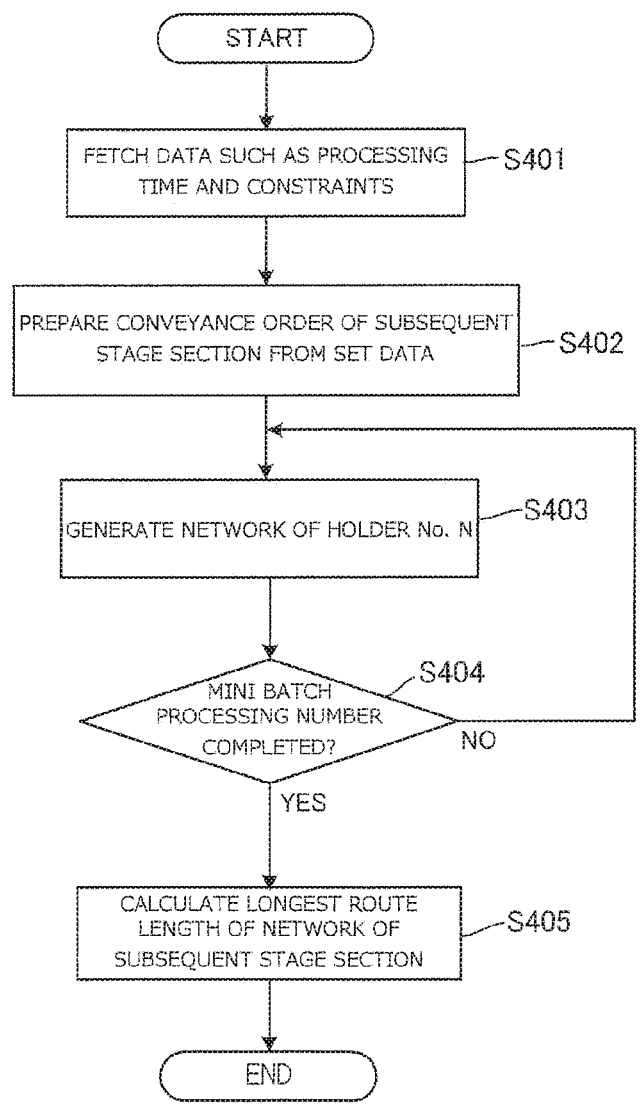
FIG. 18 is a flowchart illustrating subroutines of step S204.

Next, a specific calculation procedure of the substrate conveyance schedule of the apparatus subsequent stage section in step S204 illustrated in FIG. 18 will be described. FIG. 18 is a flowchart illustrating subroutines of step S204. As illustrated, in order to calculate the substrate conveyance schedule of the apparatus subsequent stage section, first, the substrate conveyance control scheduler 40 acquires the data such as the processing time, the constraints and the process recipes (processing conditions) related to the apparatus subsequent stage section (step S401). From the fetched data, a conveyance order of the apparatus subsequent stage section is prepared (step S402). The conveyance order is prepared based on the process recipes (processing conditions) in particular.

Subsequently, the modeling section 41 models the processing conditions, the processing time and the constraints into the nodes and the edges using the graph network theory, and generates the graph network corresponding to each substrate holder as illustrated in FIG. 4 (step S403). When the graph network for the substrate holder of the mini batch processing number given in step S202 illustrated in FIG. 16 is additionally generated (step S404, Yes), the longest route length to each node is calculated based on the generated graph network (step S405).

As described in FIG. 16, in the present embodiment, the processing conditions, the processing time and the constraints of the apparatus preceding stage section and the apparatus subsequent stage section are modeled respectively, and the preceding stage side substrate conveyance schedule in the apparatus preceding stage section and the subsequent stage side substrate conveyance schedule in the apparatus subsequent stage section are separately calculated. Therefore, the calculation is simplified compared to the case of calculating the substrate conveyance schedule of the entire apparatus, and the calculation amount and the calculation time can be reduced. Note that the apparatus preceding stage section and the apparatus subsequent stage section may be put together and the substrate conveyance schedule may be calculated at once.

In addition, according to the present embodiment, as illustrated in FIG. 15, even when the plating apparatus 10 shifts to the nonstationary state, since the substrate conveyance schedule is calculated based on the processing conditions, the processing time and the constraints, the substrate conveyance schedule appropriate in the nonstationary state can be calculated. Specifically, the appropriate substrate conveyance schedule in a sudden nonstationary state such as the fault of the plating apparatus 10 can be calculated. In addition, even in the nonstationary state that periodically occurs such as the maintenance of the substrate holder and the anode holder, the appropriate substrate conveyance schedule can be calculated.

While the embodiment of the present invention is described above, the embodiment of the invention described above is intended to facilitate understanding of the present invention, and does not limit the present invention. It is apparent that the present invention may be modified or improved without departing from the scope thereof, and the present invention includes equivalents thereof. Also, in the scope that at least part of the above-described problem can be solved or the scope that at least part of effects is presented, each component described in the scope of claims and the description can be arbitrarily combined, or omitted.

REFERENCE SIGNS LIST

10 . . . Plating apparatus
11 . . . Loading port
12 . . . Loading robot
14 . . . Spin rinse dryer
15a, 15b . . . Fixing station
23 . . . Conveyer
24 . . . Conveyer
26 . . . Plating area
30 . . . Apparatus computer
31 . . . Operation screen application
32 . . . Apparatus controller
40 . . . Substrate conveyance control scheduler
41 . . . Modeling section
42 . . . Calculation section
43 . . . Detection section
44 . . . Connecting section
45 . . . Parameter adjustment section

What is claimed is:

1. A scheduler incorporated in a substrate processing apparatus, the substrate processing apparatus comprising:
   a processor and a non-transitory memory, the non-transitory memory having stored therein instructions that when executed by the processor cause the scheduler at least to;
   model processing conditions, processing time and constraints of the substrate processing apparatus into nodes and edges of a graph network, prepare the graph network, and calculate a longest route length to each node; and
   calculate a substrate conveyance schedule based on the longest route length to each node;
   convey substrates based on the calculated conveyance schedule; and
   divide a specified processing number of the substrates into mini batches of an arbitrary number of the substrates;
   wherein preparing the graph network prepares the graph network for a mini batch;
   add an arbitrary number of a substrate for a next mini batch; and
   repeat preparation of the graph network for the next mini batch until the specified processing number.

2. The scheduler according to claim 1, wherein the memory having further stored therein instructions that when executed by the processor cause the scheduler at least to:
   detect whether or not the substrate processing apparatus has shifted to a nonstationary state,
   model the processing conditions, the processing time and the constraints of the substrate processing apparatus in the nonstationary state to the nodes and the edges when it is detected that the substrate processing apparatus has shifted to the nonstationary state, prepare the graph network and calculate the longest route length to each node, and
   calculate the substrate conveyance schedule based on the longest route length to each node in the nonstationary state.

3. The scheduler according to claim 2, wherein the nonstationary state includes a state at a time of a fault of the substrate processing apparatus, a state at a time of maintenance of a substrate holder, or a state at a time of maintenance of an anode holder.

4. A substrate conveyance method using a substrate processing apparatus, the method comprising:
   modeling processing conditions, processing time and constraints of the substrate processing apparatus into nodes and edges of a graph network, preparing the graph network, and calculating a longest route length to each node;
   calculating a substrate conveyance schedule based on the longest route length to each node;
   conveying a substrate based on the substrate conveyance schedule; and
   dividing a specified processing number of the substrates into mini batches of an arbitrary number of the substrates,
   wherein preparing the graph network prepares the graph network for a mini batch, and
   adding an arbitrary number of substrates for a next mini batch and repeating preparation of the graph network for the next mini batch until the specified processing number has been reached.

5. The substrate conveyance method according to claim 4, comprising
   detecting whether or not the substrate processing apparatus has shifted to a nonstationary state,
   wherein modeling the processing conditions, the processing time and the constraints of the substrate processing apparatus in the nonstationary state to the nodes and the edges of the graph network when it is detected that the substrate processing apparatus has shifted to the nonstationary state, preparing the graph network and calculating the longest route length to each node, and
   wherein calculating the substrate conveyance schedule based on the longest route length to each node in the nonstationary state.

6. The substrate conveyance method according to claim 5, wherein the nonstationary state includes a state at a time of a fault of the substrate processing apparatus, a state at a time of maintenance of a substrate holder, or a state at a time of maintenance of an anode holder.

* * * * *